(12) United States Patent
Kirihata et al.

(10) Patent No.: US 6,747,890 B1
(45) Date of Patent: Jun. 8, 2004

(54) GAIN CELL STRUCTURE WITH DEEP TRENCH CAPACITOR

(75) Inventors: Toshiaki Kirihata, Poughkeepsie, NY (US); Subramanian S. Iyer, Mount Kisco, NY (US); John W. Golz, Garrison, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/249,347

(22) Filed: Apr. 2, 2003

(51) Int. Cl.[7] .............................................. G11C 11/24
(52) U.S. Cl. ...................................... 365/149; 365/129
(58) Field of Search ................................ 257/296, 301, 257/303; 365/149, 164, 187, 129

(56) References Cited

U.S. PATENT DOCUMENTS

| | | | | |
|---|---|---|---|---|
| 5,442,585 A | * | 8/1995 | Eguchi et al. | 365/149 |
| 5,812,476 A | * | 9/1998 | Segawa | 365/222 |
| 5,841,690 A | * | 11/1998 | Shibutani et al. | 365/149 |
| 5,897,351 A | * | 4/1999 | Forbes | 438/242 |
| 6,016,268 A | * | 1/2000 | Worley | 365/149 |
| 6,121,106 A | * | 9/2000 | Ellis et al. | 438/386 |
| 6,314,017 B1 | * | 11/2001 | Emori et al. | 365/149 |
| 2001/0028078 A1 | * | 10/2001 | Noble | 257/303 |
| 2001/0028092 A1 | * | 10/2001 | Lowrey et al. | 257/390 |

FOREIGN PATENT DOCUMENTS

EP 0939444 A2 * 2/1999 ......... H01L/27/105

* cited by examiner

*Primary Examiner*—Mary Wilczewski
*Assistant Examiner*—Monica Lewis
(74) *Attorney, Agent, or Firm*—H. Daniel Schnurmann

(57) ABSTRACT

Gain cells adapted to trench capacitor technology and memory array configured with these gain cells are described. The 3T and 2T gain cells of the present invention include a trench capacitor attached to a storage node such that the storage voltage is maintained for a long retention time. The gate of the gain transistor and the trench capacitor are placed alongside the read and write wordline. This arrangement makes it possible to have the gain transistor directly coupled to the trench capacitor, resulting in a smaller cell size. The memory cell includes a first transistor provided with a gate, a source, and a drain respectively coupled to a read wordline, a first node, and a read bitline; a second transistor having a gate, a source, and a drain respectively coupled to a storage node, to a voltage source, and to the first node; a third transistor having a gate, a source, and a drain respectively coupled to a write wordline, the storage node, and a write bitline; and a capacitor having a first terminal connected to the storage node and a second terminal connected to a voltage source.

10 Claims, 10 Drawing Sheets

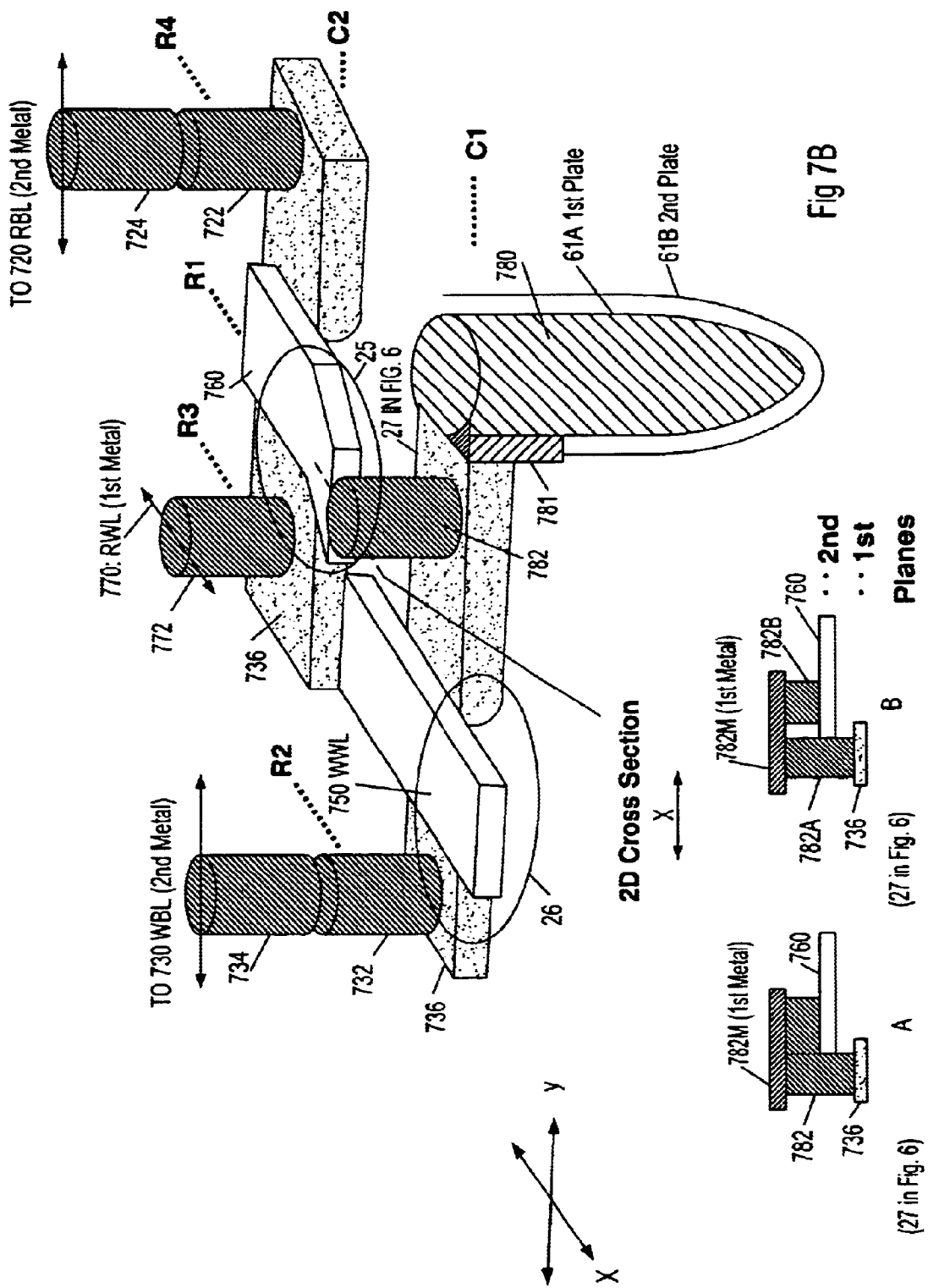

GAIN CELL STRUCTURE WITH DEEP TRENCH CAPACITOR

BACKGROUND OF INVENTION

This invention generally relates to an embedded dynamic random access memory and, more particularly, to a gain cell attached to a deep trench capacitor to enable long retention time and soft error immunity for system-on-chip applications.

Typically, semiconductor memories use six transistor static memory (6T SRAM) cells or one transistor dynamic random access memory (1T DRAM) cells. FIG. 1A shows a transistor level schematic of a typical 6T SRAM cell 0 consisting of four NMOS transistors 1, 2, 5 and 6, and two PMOS transistors 3 and 4. PMOSs 3 and 4 and NMOSs 5 and 6 are linked to each other to structure a CMOS cross-coupled latch that forms a storage element for storing a data bit. NMOSs 1 and 2 respectively couple nodes (also referred to terminals) 7 and 8 to biltlines BL and bBL when a wordline WL is activated, allowing reading or writing a data bit from the bit lines BL and bBL. When the memory is in write mode, BL or bBL switches to low depending on the write data bit. This allows flipping the CMOS cross-coupled latch to overwrite the data bit in the 6T SRAM cell 0. The overwritten data bit in the cell is maintained by the CMOS cross-coupled latch after the write operation (non-destructive write). When the memory structure is in read mode, either BL or bBL is directly driven by the CMOS cross-coupled latch. The self-gain feature of the 6T SRAM cell results in a fast read access speed. The read operation does not affect the data bit in the CMOS cross-coupled latch. The 6T SRAM cell maintains the data bit after the read operation (non-destructive read). The non-destructive write and non-destructive read features for the 6T SRAM cell achieve a fast random read and write cycle times. However, the 6T SRAM cell requires six transistors, p-type and n-type well isolation, and cross-coupled wiring, resulting in a cell six to ten times larger than a 1T DRAM cell.

FIG. 1B is a transistor level schematic representation of a 1T DRAM cell 10. It consists of one NMOS transistor 11 and a capacitor 12 (1T DRAM cell). Typically, capacitor 12 may be structured as a trench, planar or stack capacitor. When wordline WL is activated, NMOS 11 links capacitor 12 to bitline BL. The charge sharing effect between capacitor 12 and BL creates a small BL voltage. This charge sharing destroys the data bit in capacitor 12 (destructive read). The small BL voltage is sensed by a sense amplifier (not shown) coupled to BL, resulting in a slower access speed than of a 6T SRAM cell. The sense amplifier drives BL depending on the outcome of the sensing operation, rewriting the read data bit in capacitor 12 (write back). When the memory is in write mode, BL is driven either low or high, depending on the data pattern. Typically, the write mode operation is enabled after a read mode operation because only selected cells remain in the write mode, the remaining cell data bits having been destroyed when activating WL (destructive write). Accordingly, the destroyed data bits need to be rewritten by the sense amplifier simultaneously with the write data bits (read modified write). The destructive read followed by the write back and the read modified write caused by the destructive write require a longer cycle time than that of a typical 6T SRAM cell. However, a 1T DRAM cell requires only one transistor and one capacitor, resulting in a cell which is one-sixth to one-tenth smaller than a 6T SRAM cell.

FIG. 2A is a transistor level schematic representation of a 3T-gain cell. During write mode, the write wordline WWL switches to high, making it possible to couple storage node 24 to write bitline WBL through NMOS transistor 23. This operation is similar to the write operation for the previously described 1T DRAM cell. During read mode, the read wordline RWL switches to high, reading out the data to read bitline RBL through the series arrangement of NMOS transistors 21 and 22. When storage node (or terminal) 24 maintains the data at high, the two NMOS transistors 21 and 22 are both on, discharging RBL. When the storage node is held at a low voltage, NMOS transistor 22 remains off which, in turn, keeps RBL at a precharged voltage. Depending on the data pattern, RBL is directly driven by the series of NMOS transistors 21 and 22. This self-gain feature results in a fast read access speed similar to the 6T SRAM cell. The read operation does not affect the data bit present in storage node 24. The 3T-gain cell holds the data bit even after the read operation (non-destructive read out), producing a fast random read access cycle. The 3T-gain cell requires three transistors, without necessitating p-type and n-type well isolation and cross-coupled wiring, and creates a cell three times smaller than a 6T SRAM cell.

FIG. 2B is a schematic of a transistor level representation of a 2T-gain cell. Unlike the 3T-gain cell, the read NMOS switching transistor 21 is altogether eliminated. During write mode, write wordline WWL switches to high, coupling storage node 27 to write bitline WBL through NMOS transistor 26. This operation is similar to a write operation for the 1T DRAM cell. The source and drain of NMOS transistor 25 are respectively coupled to the read wordline RWL and read bitline RBL. Moreover, when in standby mode, RWL and RBL are precharged to supply voltage VDD. During read mode, the read wordline RWL switches to low. If the data bit in storage node 27 is at low, NMOS 25 remains off, leaving RBL at high. When the data bit is at high, NMOS 25 remains on, forcing RBL to switch to low. Note that RBL is driven directly by RWL. This self-gain feature results in a fast read access speed, similar to the 6T SRAM cell. The read operation does not affect the data bit in storage node 27. The 2T SRAM cell holds the data bit even after the read operation (non-destructive read), thus enabling a fast read random cycle time. The 2T gain cell requires only two transistors without requiring a p-type and n-type well isolation, and/or cross-coupled wiring, all of which results in a cell four times smaller than the size of a 6T SRAM cell.

Generally both the 3T and 2T-gain cells achieve a fast read access and significantly improved cycle times. However, as the storage node 24 or 27 voltage decreases, the self-gain is, likewise, also reduced. Furthermore, as the size of the 3T and 2T gain cells shrinks, the gate capacitor of NMOS transistor 22 or 25 also decreases, resulting in a potential performance and data retention degradation as well as a poor soft error rate.

SUMMARY OF INVENTION

Accordingly, it is an object of the present invention to provide a 2T and 3T-gain cell integrated with a deep trench capacitor.

It is another object of the present invention to improve the data retention by integrating a gain cell integrated with a deep trench capacitor.

It is a further object of the present invention to construct a gain cell structure having an outstanding error immunity.

In a first aspect of the invention, there is described a gain cell structure and an array configuration applicable to trench technology. The 3T and 2T gain cells include a trench capacitor in the storage node such that the storage voltage is maintained for a long retention time. The gate of the gain transistor and the trench capacitor are placed alongside the read and write wordline. This arrangement makes it possible to have the gain transistor directly coupled to the trench capacitor, resulting in a smaller cell size.

In a second aspect of the invention there is provided a memory cell that includes a first transistor provided with a gate, a source, and a drain respectively coupled to a read wordline, a first node, and a read bitline; a second transistor having a gate, a source, and a drain respectively coupled to a storage node, to a voltage source, and to the first node; a third transistor having a gate, a source, and a drain respectively coupled to a write wordline, the storage node, and a write bitline; and a capacitor having a first terminal connected to the storage node and a second terminal connected to a voltage source.

In a second aspect of the invention there is provided a memory cell that includes: a first transistor having a gate, a source, and a drain respectively coupled to a storage node, a read wordline, and a read bitline; a second transistor having a gate, a source, and a drain respectively coupled to a write wordline, a write bitline, and the storage node; and a capacitor having a first terminal connected to the storage node and a second terminal connected to a voltage source.

BRIEF DESCRIPTION OF DRAWINGS

The accompanying drawings, which are incorporated in and which constitute a part of the specification, illustrate presently preferred embodiments of the invention and, together with the general description given above and the detailed description of the preferred embodiments given below, serve to explain the principles of the invention.

FIG. 7B is a perspective view of a 2T-gain cell with various components of the cell connected to respective wordlines and bitlines.

DETAILED DESCRIPTION

Figure 1:
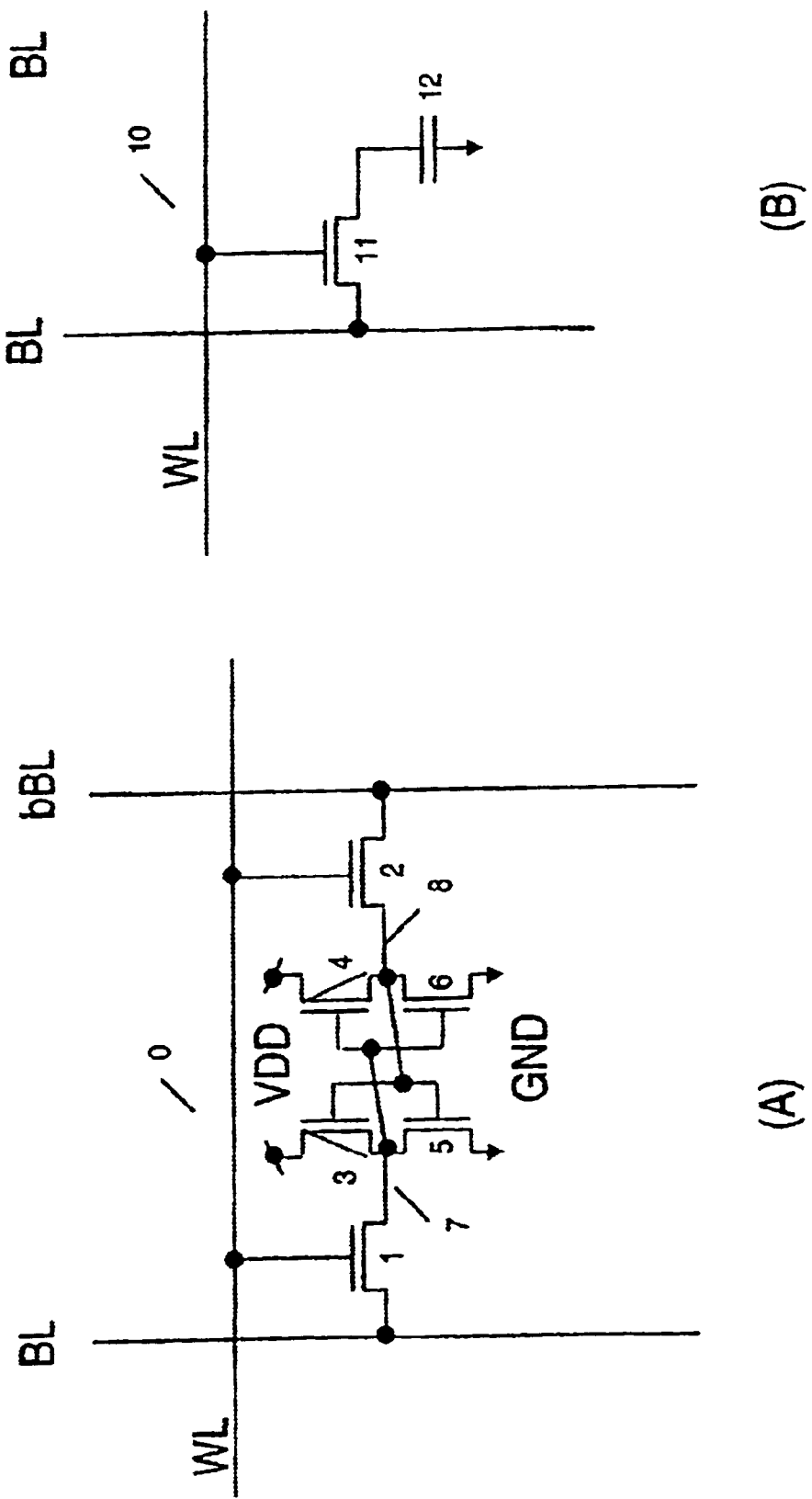
FIGS. 1A and 1B are transistor level schematics, respectively showing a prior art 6T SRAM cell and a typical 1T DRAM cell.
Figure 2:
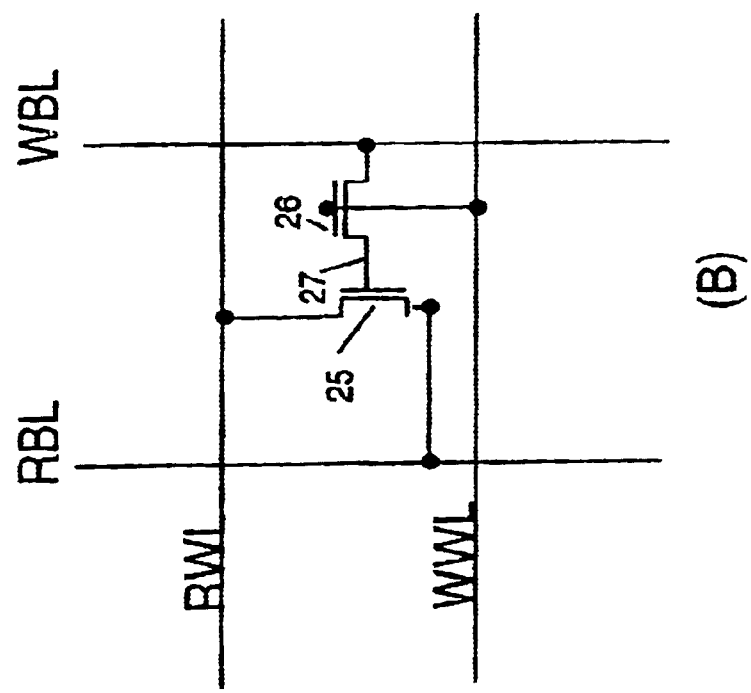
FIGS. 2A and 2B are transistor level schematics, respectively showing a prior art 3T-gain cell and a conventional 2T-gain cell.
Figure 2:
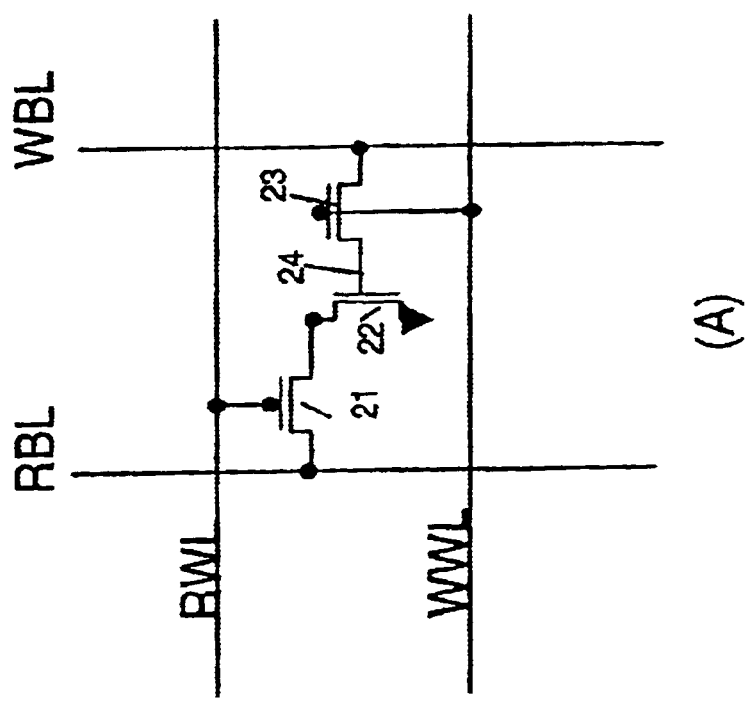
Figure 3:
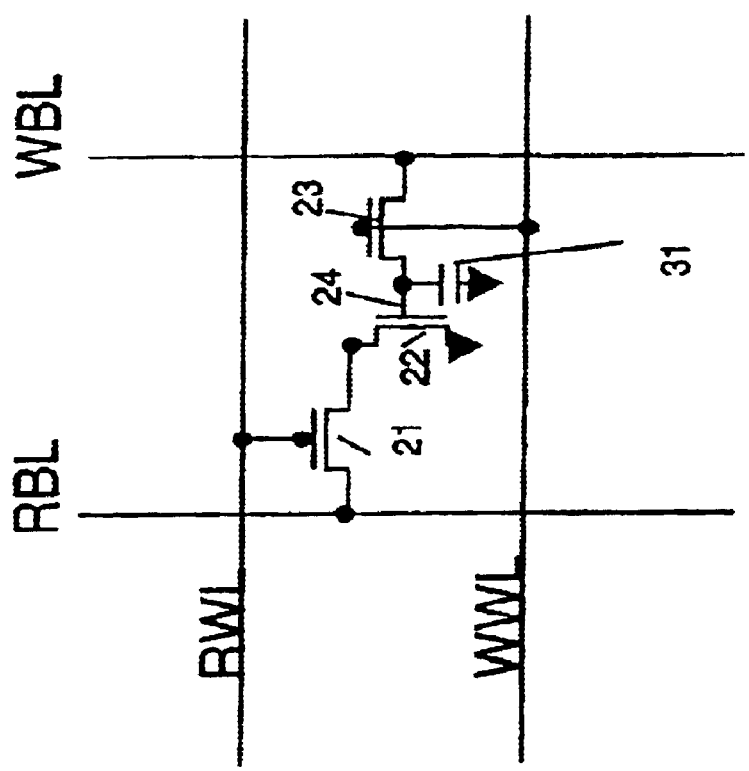
FIG. 3 is a schematic diagram of a first embodiment of the present invention, wherein a 3T-gain cell adapted to the trench technology is illustrated.

FIG. 3 is a schematic diagram of a first embodiment of the present invention, wherein a 3T-gain cell is adapted to trench technology. Similar to an existing 3T-gain cell, it consists of three transistors 21, 22, and 23 supported by read wordline RWL, read bitline RBL, write wordline WWL, and write bitline WBL. The operation and control are the same as for the existing 3T-gain cell discussed in the Background of the Invention, and therefore will not be discussed further. The 3T-gain cell for trench technology integrates trench capacitor 31 by coupling the capacitor to storage node 24.

Figure 4A:
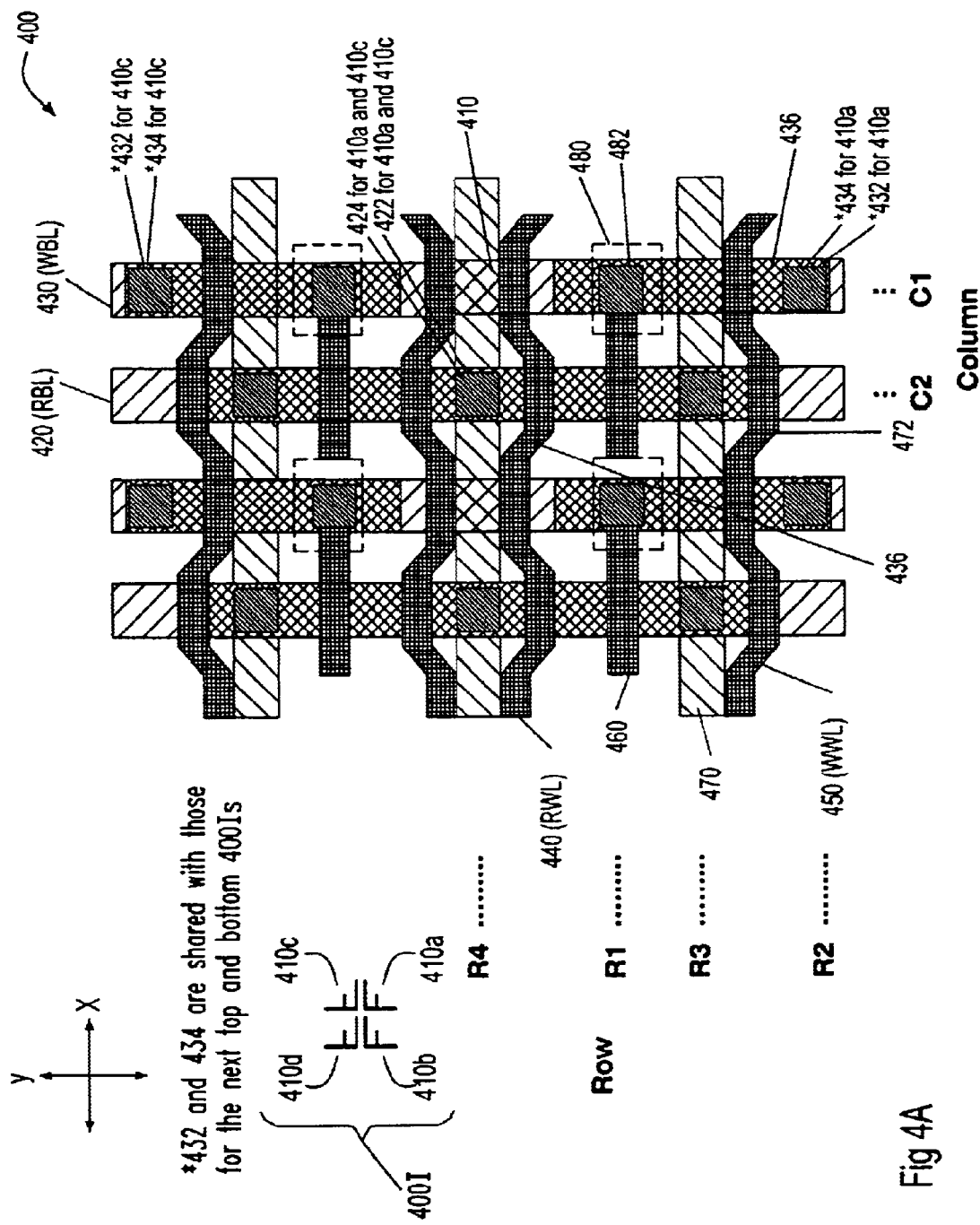
FIG. 4A shows the layout of the 3T-gain cell, according to the present invention.
Figure 4B:
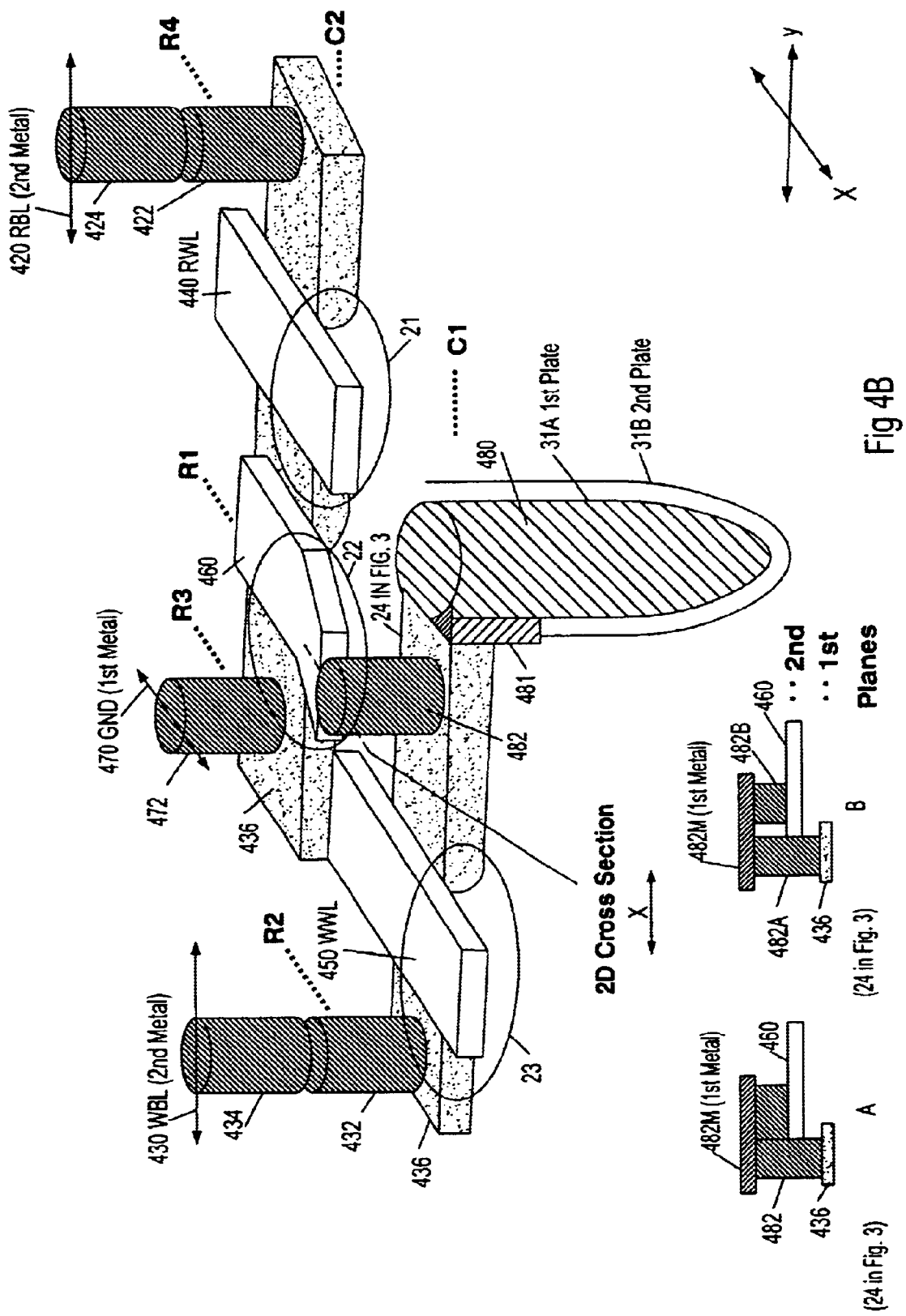
FIG. 4B shows a perspective view of the 3T-gain cell with various components of the cell connected to respective wordlines and bitlines.

FIG. 4A shows the mask data of a 3T-gain cell 400 with trench capacitor 31 coupled to storage node 24. A perspective view of the 3T-gain cell of the present invention is shown in FIG. 4B.

A 3T-gain cell unit 400l consisting of four 3T-gain individual cells 410a, 410b, 410c, and 410d are arranged in a 2 by 2 matrix, F showing the direction of the arrangement. More specifically, two 3T-gain cells 410a and 410b are oriented in the x-direction without flipping or rotation. The remaining two 3T-gain cells 410c and 410d are oriented in the y-direction, and are flipped as shown. This arrangement allows a first level metal contact 422 and second level metal contact 424 to be stacked and shared between the top and bottom of the gain cells (i.e., 410a and 410c or 410b and 410d). This arrangement also allows a first level metal contact 432 and second level metal contact 434 to be stacked and shared between the gain cells positioned in an adjacent top and bottom unit 400l.

The detailed structure and the transistor arrangement of the 3T-gain cell 410 will be explained next describing the case where the row and column are arranged in both the x and y directions. Write wordline (WWL) and read wordline (RWL) use a corresponding continuous long polysilicon connection (i.e., 440 and 450) spanning in the x-direction. They may be stitched to third level metal layer, preferably in a stitched area (not shown). This reduces the time constant of the read and the write wordline delay. Write bitline 430 (WBL) uses a continuous second level metal spanning in the y-direction. Read bitline 420 (RBL) also uses a corresponding continuous second level metal spanning in the y-diection. A diffuision mask 436 is placed in a direction perpendicular to the WWL polysilicon 450 on alternate column, creating an NMOS write transistor 23 when implanted with n+ doping. The source of the write transistor (23 in FIG. 3) is coupled to WBL 430 with the second level metal through the first level metal contact 432 and the second level metal contact 434. The contacts 432 and 434 are shared with the next top and bottom unit (400I), as shown, allowing write bitlines 430 (WBL) in each column to support a plurality of the 3T-gain cells (i.e., 410a and 410c) on the same column through the corresponding second level metal contacts 434 applicable to 410a and 410c FIG. 4A. The drain of the write transistor 23 (in FIG. 3) is coupled to trench capacitor 480 having two plates 31A and 31B, by making a connection at storage node 24 (in FIG. 3). The trench capacitor does not preferably exceed 2.5 fF. The storage node is coupled to the short polysilicon connection 460 by way of contact 482, i.e., the gate of the gain transistor 22 (in FIG. 3). Contact 482, also referred to conductive strap, may be a single contact as shown in the 2-D cross section A by way at contacts 482 and the first metal 482M, or form a conductive bridge, as shown in the 2-D cross section B, by way of contacts 482A, 482B and the first metal 482M. Diffusion mask 436 is placed in a direction perpendicular to the read wordline 440 (RWL) and the short polysilicon gate 460 in every second alternating column, thereby forming an NMOS read access transistor 21 (in FIG. 3) and NMOS gain transistor 22 (in FIG. 3) by way of n+ implantation. The source of the NMOS gain transistor is coupled to the first level metal GND connection 470 through first level metal contact 472. The first level metal GND interconnection runs in the x-direction, similar to the write wordline 450 (WWL) and read wordline 440 (RWL). The drain of the gain transistor and the source of the read transistor are coupled to each other by way of n+ diffusion 436. The drain of the read access transistor is coupled to the second level metal read bitline RBL 420 through the first level metal contact 422 and second metal contact 424. These contacts are shared between the top and bottom cells (i.e. 410c and 410a) as shown in FIG. 4A.

Figure 5:
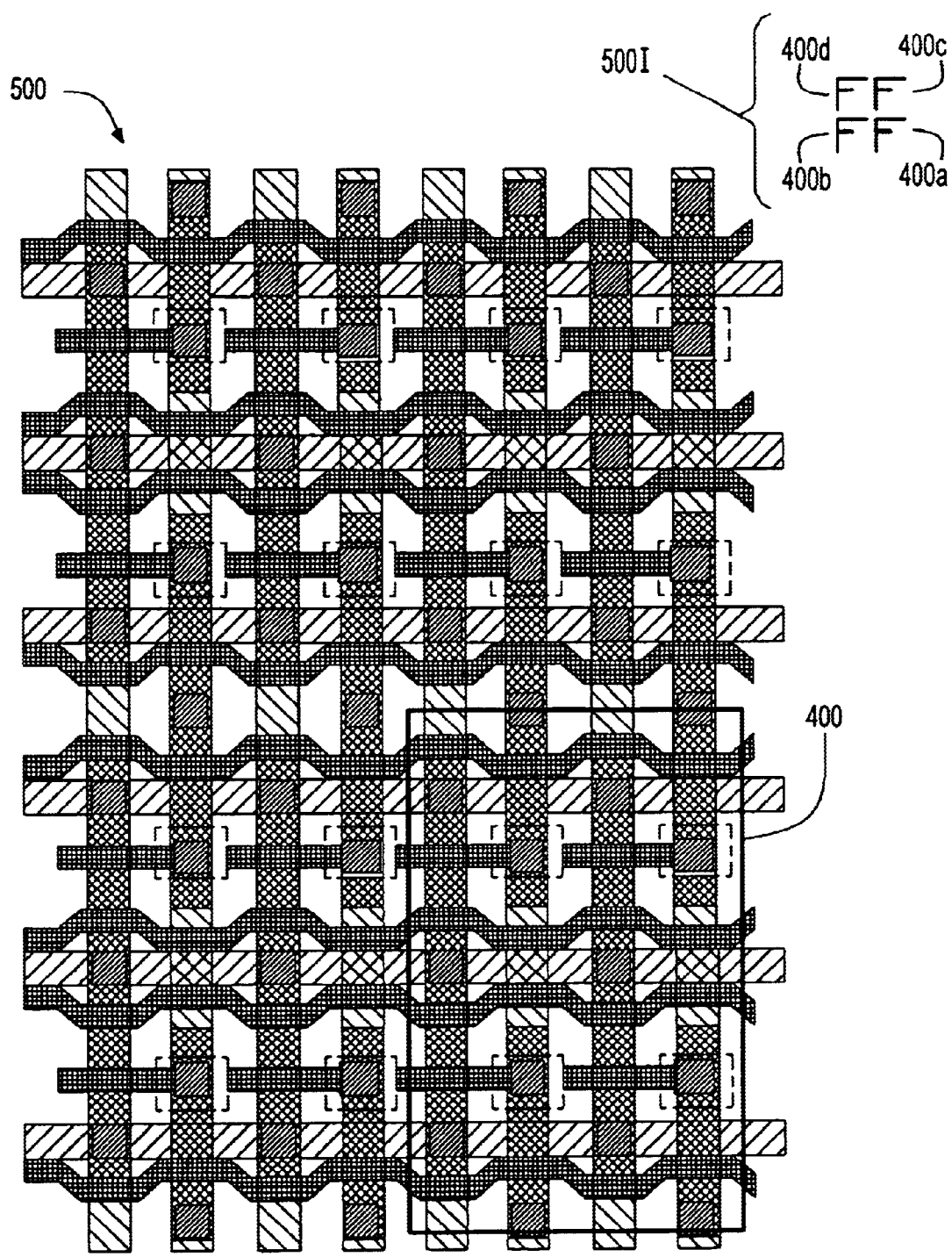
FIG. 5 shows the layout of an array formed by a plurality of 3T-gain cells arranged in a matrix formation.

FIG. 5 shows an array 500, consisting of a plurality of 3T-gain cells. The present example illustrates a 2 by 2 matrix consisting of 3T gain cells 400a, 400b, 400c, and 400d forming a cell unit referenced by numeral 500I, wherein F shows the direction of arrangement of the unit, and wherein of a plurality of cell units results in a 16 bit-array organization. However, the present invention is not limited to only this array organization. By arranging additional units 400I either in the x or y direction, or in the x and y direction, practically any array can be configured.

Figure 6:
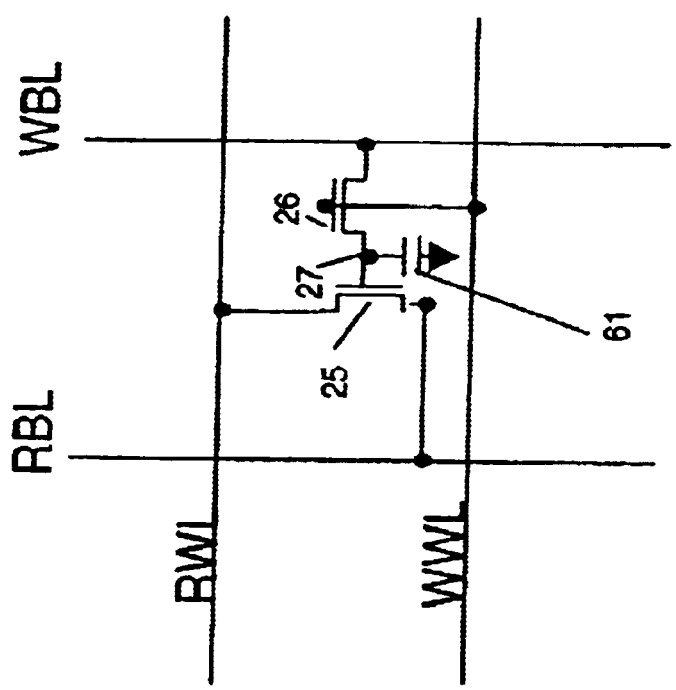
FIG. 6 is a schematic diagram of a second embodiment of the invention showing a 2T-gain cell integrated with a trench capacitor.

FIG. 6 shows a schematic diagram of a second embodiment of the invention. Similar to the previously described 2T-gain cell, it consists of two transistors 25 and 26 serviced by the read wordline RWL, read bitline RBL, write wordline WWL, and write bitline WBL. The operation and control are the same as those for the 2T-gain cell described in the Background of the Invention, and thus, will not be discussed further. The 2T-gain cell integrates trench capacitor 61 by connecting its outer terminal to storage node 27.

Figure 7A:
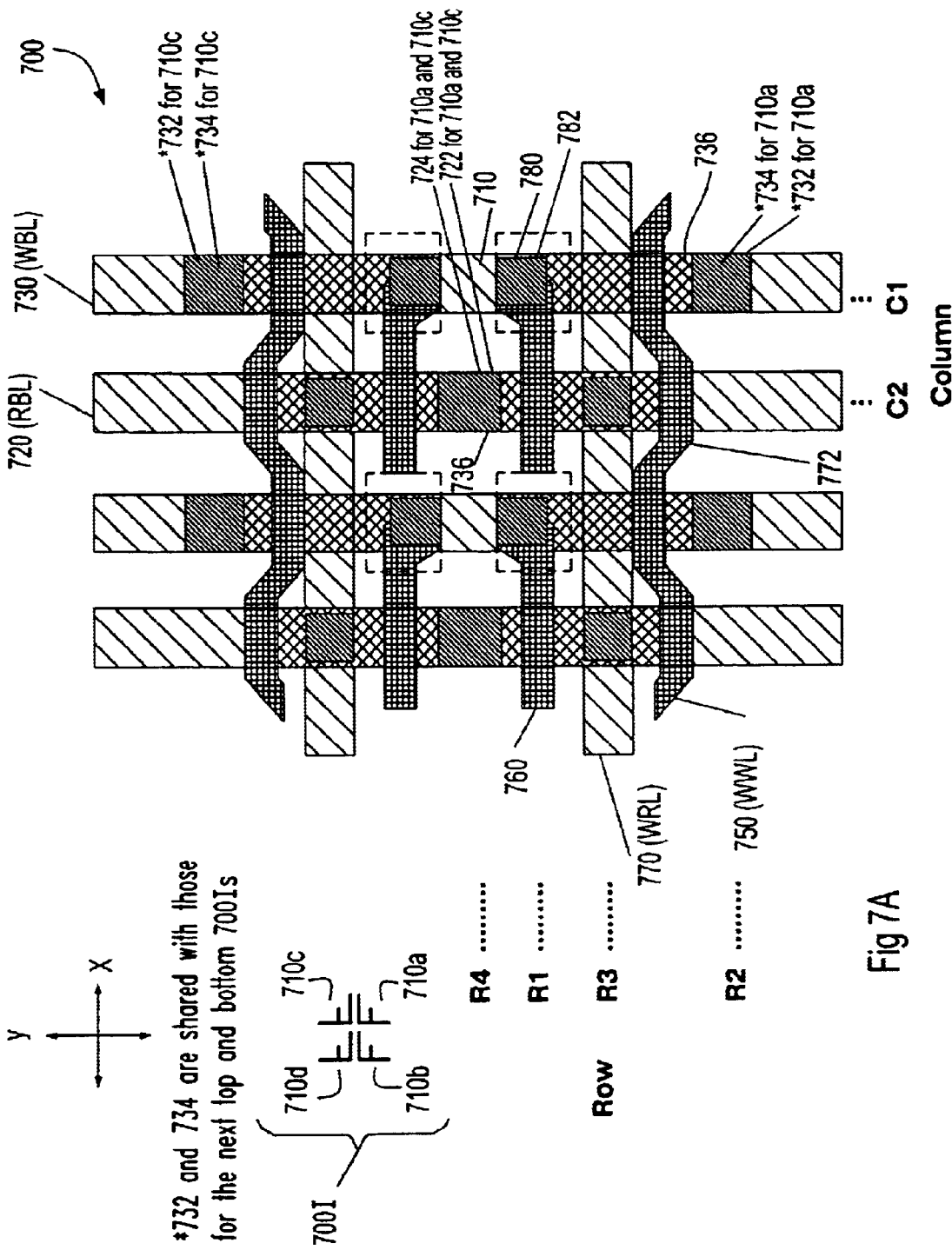
FIG. 7A shows the layout of the 2T-gain cell of the invention with four 2T-gain cells arranged in a 2 by 2 matrix unit.

FIG. 7A is a schematic diagram of the layout of a 2T-gain cell array 700. A perspective view of a cross-section of a 2T-gain cell is shown in FIG. 7B.

The 2T-gain cell base array is formed by a plurality of units 700I, each consisting of 2T-gain cells 710a, 710b, 710c, and 710d and is arranged in a 2 by 2 matrix formation, with F showing the orientation of the arrangement. More specifically, two of the 2T-gain cells (i.e., 710a and 710b) are arranged in the x-direction without flipping or rotation of the cells. The remaining 2T-gain cells (i.e., 710c and 710d) are positioned in the y-direction, and are flipped as shown. This arrangement allows read bitline stacked first level and second level contact (722 and 724) to be shared between the top and bottom of the gain cells (i.e. 710b and 710d or 710a and 710c). This arrangement also allows a write bitline stacked contact (732 and 734) to be shared with the gain cells in the next top and bottom of unit 700I (i.e. 710a). Details of the 2T-gain cell and of the transistor arrangement of each 2T-gain cell (710) will now be explained in more detail, limiting the discussion to a single row and a single column, respectively in the x and y directions.

Referring to the x-direction, write wordline (WWL) 750 uses a continuous long polysilicon connection, which is preferably stitched to third level metal layer in a stitched area (not shown). Also in the x-direction, read wordline 770 (RWL) uses the corresponding first level metal, whereas in the y-direction, write bitline 730 (WBL) and read bitline 720 (RBL) use the corresponding continuous second level metals. Diffusion mask 736 is positioned in a direction perpendicular to the WWL polysilicon in every alternating column, forming an NMOS write transistor 26 (in FIG. 6) by implanting n+ doping. The source of the write transistor 26 (in FIG. 6) is coupled to WBL 730 through first level metal contact 732 and second level metal contact 734. Contacts 732 and 734 are shared between the top and bottom cells, as shown, allowing WBL 730 in each column to support a plurality of the 2T-gain cells attached to the same column (i.e., 710a and 710c). The drain of the write transistor 26 (in FIG. 6) is connected to trench capacitor 780 having two plates 61A and 61B, at storage node 27 (in FIG. 6). The storage node is coupled to short polysilicon 760 by way of gate contact 782 to form the gate of the gain transistor 25 (in FIG. 6). Contact 782, also referred to as conductive strap, may be a single contact by way of first level metal contact 782 and first metal 782M, as shown in the 2-D cross section A. Alternatively, it may form a conductive bridge, as shown in the 2-D cross section B, by way of the first level metal contacts 782A, 782B and first metal 782M. Diffusion mask 736 is positioned perpendicular to first level metal RWL 770 with the short polysilicon gate 760 placed in every other alternating column, creating an NMOS gain transistor 25 (in FIG. 6) by n+ implantation. The source of the NMOS gain transistor is connected to RWL 770 through first level metal contact 772. The drain of the gain transistor is linked to second level metal read bitline RBL 720 through fist level metal contact 722 and second level metal contact 724. These contacts are shared between the top and bottom cells, as shown.

Figure 8:
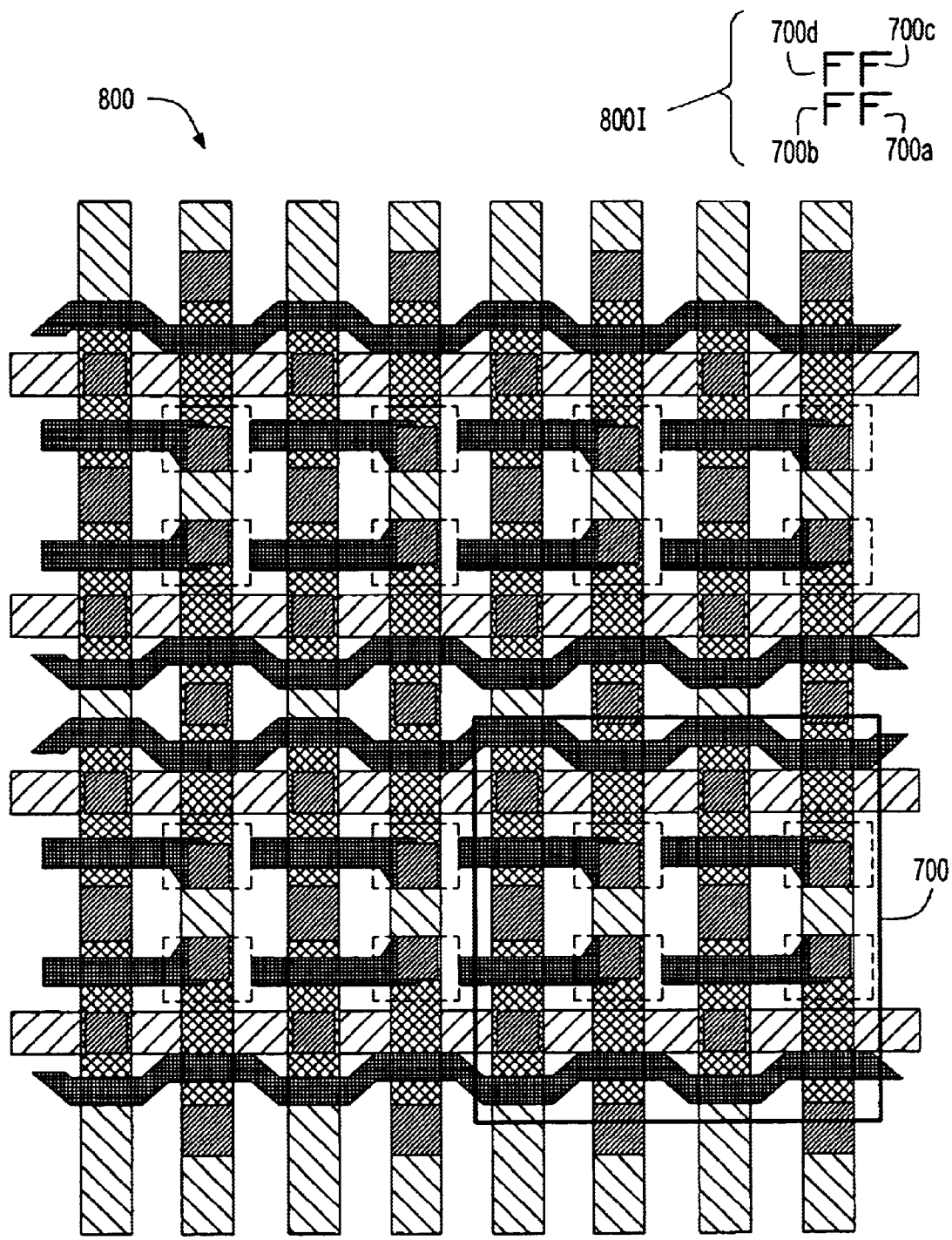
FIG. 8 shows the layout of a 16-bit array formed by a plurality of 2T-gain cells arranged in a matrix formation.

FIG. 8 shows the layout of an array 800, corresponding to a plurality of 2T-gain arranged in a matrix, and more particularly, for illustrative purposes, a 2 by 2 matrix formation of 2T gain cell units (700a, 700b, 700c, and 700d), each consisting of a 2 by 2 matrix of 2T-gain cells (710a, 710b, 710c, and 710d shown in FIG. 7A), forming unit 800I, with F showing the direction of the 700 unit arrangement, the plurality of units forming a 16 bit-array. Practitioners in the art will recognize that this invention is not limited only to this array matrix. By arranging more units 800I in either the x or y-direction or in both, x and y-directions, any array can be configured.

While the present invention has been described in terms of several embodiments, those skilled in the art will realize that various changes and modifications can be made to the subject matter of the present invention all of which fall within the scope and the spirit of the appended claims.

Having thus described the invention, what is claimed as new and desired to secure by Letter Patent is as follows:

1. A memory cell comprising:
   a first transistor provided with a gate, a source, and a drain respectively coupled to a read wordline of a memory array, a first node, and a read bitline of said memory array;
   a second transistor having a gate, a source, and a drain respectively coupled to a storage node, to a voltage source, and to said first node;
   a third transistor having a gate, a source, and a drain respectively coupled to a write wordline of said memory array, to said storage node, and to a write bitline of said memory array; and
   a capacitor having a first terminal connected to said storage node and a second terminal connected to a voltage source,
   wherein the coupling of the gate of said second transistor to said storage node, the coupling of the source of said third transistor to said storage node, and the coupling the first terminal of the capacitor to said storage node are implemented by a first conductive strap having a first layer metal contact (482) and a first metal layer (482M) arranged in a first row and a first column of said memory array; and
   wherein said write bitline is arranged over said first conductive strap (482) in said first column of said memory array with a second metal layer (430) coupled to the drain of said third transistor, staking a first level metal contact (432) and a second metal contact (434) in a second row and said first column of said memory array.

2. The memory cell as recited in claim 1, wherein the source of said second transistor to said voltage source is implemented by a second conductive strap (472) having a first metal contact (472) in a third row and a second column of said memory array; and wherein said read bitline is positioned over said second conductive strap in a second column of said memory array with a second metal layer (420) coupled to the drain of said first transistor by staking first level metal contact (422) and second metal contact (424) in a fourth row and said second column of said memory array.

3. The memory cell as recited in claim 1 wherein the capacitor is a trench capacitor, vertically configured under said first conductive strap (482).

4. The memory cell as recited in claim 1 wherein the capacitor has a capacitance not exceeding 2.5 fF.

5. The memory cell as recited in claim 1 wherein said capacitor is a shallow trench vertically configured under said first conductive strap.

6. A memory cell comprising:
a first transistor having a gate, a source, and a drain respectively coupled to a storage node, a read wordline of a memory array, and a read bitline of said memory array;
a second transistor having a gate, a source, and a drain respectively coupled to a write wordline of said memory array, a write bitline of said memory array, and said storage node; and
a capacitor having a first terminal connected to said storage node and a second terminal connected to a voltage source,
wherein the coupling the gate of said first transistor to said storage node, the coupling of the drain of said second transistor to said storage node, and the coupling of the first terminal of said capacitor to said storage node are realized by a first conductive strap (782) with a first metal contact (782) and a first metal layer (782M) arranged in a first row and a first column of said memory array, and
wherein the write bitline of said memory array is positioned over said first conductive strap (782) in said first column of said memory array with a second metal layer coupled to the source of the second transistor by staking a first level metal contact (732) and a second metal contact (734) in a second row and first column of said memory array.

7. A memory cell comprising:
in a second column, a first transistor provided with a gate, a source, and a drain respectively coupled to a read wordline of a memory array, a first node, and a read bitline of said memory array, and a second transistor having a gate, a source, and drain respectively coupled to a storage node, to a voltage source and to said first node;
in a first column, a third transistor having a gate, a source, and a drain respectively coupled to a write wordline of said memory array, to said storage node, and to a write bitline of said memory array, said source in a first plane having a "first" first metal contact (482A) connected to the gate of said second transistor in a second plane having a "second" first metal contact (482B) through a first conductive bridge (482) arranged in a first row and the first column of said memory array, wherein the write bitline over said first conductive strap (482) with a second metal layer is coupled to the drain of the third transistor by staking a first level metal contact (432) and a second metal contact (434) arranged in a second row and the first column of said memory array.

8. The memory cell as recited in claim 7, wherein coupling the source of the second transistor to the voltage source is realized in a second column by a second conductive strap (472) in a third row and second column, of said memory array, wherein the read bitline over said second conductive strap (472) in the second column of said memory array with a second metal layer are coupled to the drain of the first transistor by staking first level metal contact (422) and second metal contact (424) in fourth row and the second column of said memory array.

9. The memory cell as recited in claim 7, wherein said first level contacts (482A and 482B) form a common contact.

10. The memory cell as recited in claim 6, wherein the coupling of the source of said first transistor to the read wordline of said memory of said memory array is realized by a second conductive strap (772) with a first metal layer in a third row and second column of said memory array, and wherein the read bitline of said memory array is positioned over said second conductive strap in the second column of said memory array with a second metal layer coupled to the drain of said first transistor by staking a first level metal contact (772) and a second metal contact (724) in fourth row and the second column of said memory array.

* * * * *